United States Patent

Sonohara et al.

[11] Patent Number: 5,901,234
[45] Date of Patent: *May 4, 1999

[54] GAIN CONTROL METHOD AND GAIN CONTROL APPARATUS FOR DIGITAL AUDIO SIGNALS

[75] Inventors: Mito Sonohara, Tokyo; Kyoya Tsutsui, Kanagawa, both of Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/597,829

[22] Filed: Feb. 7, 1996

[30] Foreign Application Priority Data

Feb. 14, 1995 [JP] Japan ................................ 7-025221

[51] Int. Cl.⁶ ........................................................ H03G 3/00
[52] U.S. Cl. ........................... 381/104; 381/106; 381/107; 704/204; 704/225; 704/230
[58] Field of Search ........................ 395/2.13, 2.34–2.36, 395/2.38, 2.39, 2.67; 381/104, 106, 107; 704/204, 225, 227–230, 258

[56] References Cited

U.S. PATENT DOCUMENTS

| | | |
|---|---|---|
| 3,515,792 | 6/1970 | Deutsch . |
| 3,929,053 | 12/1975 | Deutsch . |
| 4,492,930 | 1/1985 | Knowles et al. ................ 330/284 |
| 4,896,362 | 1/1990 | Veldhuis et al. ................ 381/30 |
| 5,105,463 | 4/1992 | Veldhuis et al. ................ 381/30 |
| 5,109,417 | 4/1992 | Fielder et al. ................ 381/36 |
| 5,117,228 | 5/1992 | Fuchigami et al. . |
| 5,128,963 | 7/1992 | Akagiri ................ 375/25 |
| 5,134,658 | 7/1992 | Chen et al. ................ 381/46 |
| 5,185,800 | 2/1993 | Mahieux ................ 381/29 |

(List continued on next page.)

FOREIGN PATENT DOCUMENTS

| | | | |
|---|---|---|---|
| 61-201526 | 9/1986 | Japan | H04B 14/00 |
| 63-7023 | 1/1988 | Japan | H03M 1/00 |
| WO 95/21489 | 8/1995 | WIPO | H03M 7/30 |

OTHER PUBLICATIONS

R.E. Crochiere, Digital Coding of Speech in Sub–bands, 55 Bell Bell Syst. Tech J. No. 8 (1976).
J.E. Rothweiler, "Polyphase Quadrature Filters—A New Subband Coding Technique", Boston ICASSP 83, Boston.
J.P. Princen and A.B. Bradley, "Subband Transform Coding Using Filter Bank Based on Time Domain Aliasing Cancellation", ICASSP 1987.
M.A. Krassner, The Critical Band Encoder—Digital Encoding of the Perceptual Requirements of the Auditory System, ICASSP 1980.
IEEE Transactions of Acoustics, Speech and Signal Processing, vol. ASSP–25, No. 4, Aug. 1977.

*Primary Examiner*—Curtis A. Kuntz
*Assistant Examiner*—Duc Nguyen
*Attorney, Agent, or Firm*—Limbach & Limbach LLP

[57] ABSTRACT

A signal encoding method and apparatus for encoding an acoustic signal, a recording medium having the encoded signals, a method for transmitting the encoded signals, and a signal decoding apparatus for decoding the encoded signals, are disclosed. With the encoding apparatus, an attack portion detection circuit detects an attack portion of the waveform acoustic signal where the waveform elements of the waveform acoustic signal rise sharply. A gain control circuit controls the gain for waveform elements at least upstream of the attack portion using a gain control amount adaptively selected from plural gain control amounts specified by a pre-set power of 2. A forward orthogonal transform circuit transforms the waveform acoustic signal into plural spectral components. A normalization and encoding circuit normalizes, quantizes and encodes the gain control information an plural spectral components. With the encoding apparatus, the encoding efficiency may be improved without complicating the construction, while the pre-echo may be suppressed effectively.

36 Claims, 12 Drawing Sheets

U.S. PATENT DOCUMENTS

| | | | |
|---|---|---|---|
| 5,264,846 | 11/1993 | Oikawa | 341/76 |
| 5,268,685 | 12/1993 | Fujiwara | 341/76 |
| 5,299,240 | 3/1994 | Iwahashi et al. | 375/122 |
| 5,381,143 | 1/1995 | Shimoyoshi et al. | 341/51 |
| 5,394,473 | 2/1995 | Davidson | 395/2.38 |
| 5,454,011 | 9/1995 | Shimoyoshi | 375/240 |
| 5,461,378 | 10/1995 | Shimoyoshi et al. | 341/51 |
| 5,490,170 | 2/1996 | Akagiri et al. | 395/2.13 |
| 5,502,789 | 3/1996 | Akagiri | 395/2.13 |
| 5,541,600 | 7/1996 | Blumenkrantz et al. | |
| 5,550,924 | 8/1996 | Helf et al. | 381/94 |
| 5,581,654 | 12/1996 | Tsutsui | 395/2.39 |
| 5,731,767 | 3/1998 | Tsutsui et al. | |

GAIN CONTROL METHOD AND GAIN CONTROL APPARATUS FOR DIGITAL AUDIO SIGNALS

BACKGROUND OF THE INVENTION

This invention relates to a signal encoding method and apparatus for encoding acoustic signals, such as digital audio signals, by so-called high efficiency encoding, and a recording medium having the encoded signals recorded thereon. The invention also relates to a method for transmitting the encoded signals, and a signal decoding apparatus for decoding the encoded signals.

There exist a variety of high efficiency encoding techniques of encoding audio or speech signals. Examples of these techniques include transform coding in which a frame of digital signals representing the audio signal on the time axis is converted by an orthogonal transform into a block of spectral coefficients representing the audio signal on the frequency axis, and a sub-band coding in which the frequency band of the audio signal is divided by a filter bank into a plurality of sub-bands without forming the signal into frames along the time axis prior to coding. There is also known a combination of sub-band coding and transform coding, in which digital signals representing the audio signal are divided into a plurality of frequency ranges by sub-band coding, and transform coding is applied to each of the frequency ranges.

Among the filters for dividing a frequency spectrum into a plurality of equal-width frequency ranges, there is the quadrature mirror filter (QMF) as discussed in R. E. Crochiere, Digital Coding of Speech in Sub-bands, 55 Bell Syst. Tech J. No. 8 (1976). With such QMF filter, the frequency spectrum of the signal is divided into two equal-width bands. With the QMF, aliasing is not produced when the frequency bands resulting from the division are subsequently combined together.

In "Polyphase Quadrature Filters- A New Subband Coding Technique", Joseph H. Rothweiler ICASSP 83, Boston, there is shown a technique of dividing the frequency spectrum of the signal into equal-width frequency bands. With the present polyphase QMF, the frequency spectrum of the signals can be divided at a time into plural equal-width frequency bands.

There is also known a technique of orthogonal transform including dividing the digital input audio signal into frames of a predetermined time duration, and processing the resulting frames using a discrete Fourier transform (DFT), discrete cosine transform (DCT) and modified DCT (MDCT) for converting the signal from the time axis to the frequency axis. Discussions on MDCT may be found in J. P. Princen and A. B. Bradley, "Subband Transform Coding Using Filter Bank Based on Time Domain Aliasing Cancellation", ICASSP 1987.

By quantizing the signals divided on the band basis by the filter or orthogonal transform, it becomes possible to control the band subjected to quantization noise and psychoacoustically more efficient coding may be performed by utilizing the so-called masking effects. If the signal components are normalized from band to band with the maximum value of the absolute values of the signal components, it becomes possible to effect more efficient coding.

For quantizing signals split into plural frequency bands, it is known to divide the frequency spectrum into plural frequency bands taking into account the psychoacoustic characteristics of the human hearing mechanism. That is, spectral coefficients representing an audio signal on the frequency axis may be divided into a plurality of, for example, 25, critical frequency bands. The width of the critical bands increase with increasing frequency.

For encoding signals of the respective frequency bands, a pre-set number of bits are allocated from one frequency band to another, or encoding by adaptive bit allocation is performed from one frequency band to another. For example, when applying adaptive bit allocation to the spectral coefficient data resulting from MDCT, the spectral coefficient data generated by the MDCT within each of the critical bands is quantized using an adaptively allocated number of bits.

There are presently known the following two bit allocation techniques. For example, in IEEE Transactions of Acoustics, Speech and Signal Processing, vol. ASSP-25, No.4, August 1977, bit allocation is carried out on the basis of the amplitude of the signal in each critical band. This technique produces a flat quantization noise spectrum and minimizes the noise energy, but the noise level perceived by the listener is not optimum because the technique does not effectively exploit the psychoacoustic masking effect.

In the bit allocation technique described in M. A. Krassner, The Critical Band Encoder- Digital Encoding of the Perceptual Requirements of the Auditory System, ICASSP 1980, the psychoacoustic masking mechanism is used to determine a fixed bit allocation that produces the necessary signal-to-noise ratio for each critical band. However, if the signal-to-noise ratio of such a system is measured using a strongly tonal signal, for example, a 1 kHz sine wave, non-optimum results are obtained because of the fixed allocation of bits among the critical bands.

For overcoming these inconveniences, a high efficiency encoding apparatus has been proposed in which the total number of bits available for bit allocation is divided between a fixed bit allocation pattern pre-set for each small block and a block-based signal magnitude dependent bit allocation, and the division ratio is set in dependence upon a signal which is relevant to the input signal, such that, the smoother the signal spectrum, the higher becomes the division ratio for the fixed bit allocation pattern, that is the smaller becomes the division ratio for block-based signal magnitude dependent bit allocation.

With this technique, if the energy is concentrated in a particular spectral component, as in the case of a sine wave input, a larger number of bits are allocated to the block containing the spectral component, for significantly improving the signal-to-noise characteristics in their entirety. Since the human auditory system is highly sensitive to a signal having acute spectral components, such technique may be employed for improving the signal-to-noise ratio for improving not only measured values but also the quality of the sound as perceived by the ear.

In addition to the above techniques, a variety of other techniques have been proposed, and the model simulating the human auditory system has been refined, such that, if the encoding device is improved in its ability, encoding may be made with higher efficiency in light of the human auditory system.

If DFT or DCT is utilized as the method for transforming the waveform signal (sample data) such as the time-domain digital audio signals, into a spectral signal, transform is executed using a time block made up of M sample data, and orthogonal transform such as DFT or DCT is carried out on the block basis. Such block-based orthogonal transform produces M independent real-number data (DFT coefficient data or DCT coefficient data). The M real-number data, thus produced, are subsequently quantized and encoded to give encoded data.

For decoding the encoded data to regenerate playback acoustic signals, the encoded data are decoded and dequantized to give real-number data, which then is inverse orthogonal-transformed by IDFT or IDCT. The resulting blocks made up of waveform element signals are linked together for regenerating acoustic signals.

The playback acoustic signals, thus generated, suffer from psychoacoustically undesirable linking distortion caused by block linking. For reducing the inter-block linking distortion, Ml sample data of both neighboring blocks are overlapped at the time of orthogonal transform employing DFT or DCT.

However, if M1 sample data each are overlapped on both neighboring blocks for carrying out orthogonal transform, M sample data are produced for (M-M1) sample data on an average, so that the number of real-number data obtained on orthogonal transform is larger than the number of the original sample data employed for orthogonal transform. Since the real-number data are subsequently quantized and encoded, such increase in the number of the real-number data obtained in orthogonal transform beyond the number of the original sample data is not desirable in view of the coding efficiency.

If MDCT is employed for orthogonal transform of acoustic data consisting of sample data such as digital audio signals, orthogonal transform is carried out using 2 M sample data by overlapping M sample data on both neighboring blocks, for reducing the inter-block linking distortion for producing independent M real-number data (MDCT coefficient data). In this manner, M real-number data are obtained for M sample data on an average with MDCT so that higher efficiency encoding may be realized than with DFT or DCT.

For decoding the encoded data obtained on quantizing and encoding the real-number data by MDCT for generating playback acoustic signals, the encoded data is decoded and dequantized to give real-number data which is then inverse orthogonal-transformed by IMDCT on the basis of blocks corresponding to the overlapped blocks at the time of encoding to produce in-block waveform elements. These in-block waveform elements are added together with interference for reconstructing acoustic signals.

In general, if the length of a block for orthogonal transform (size of the block along time axis) for orthogonal transform is increased, frequency resolution is improved. If the acoustic signals, such as digital audio signals, are orthogonal-transformed using such long blocks, the signal energy is concentrated in specified spectral components. On the other hand, if orthogonal transform is performed for blocks in which sufficiently long overlap is accorded in both neighboring blocks, inter-block distortion of acoustic signals may be reduced satisfactorily. If orthogonal transform is performed by MDCT on blocks in which the number of sample data equal to one-half the number of sample data of a block are overlapped between the neighboring blocks, and if the number of the real-number data obtained on orthogonal transform is not increased as compared to the number of the original acoustic signals, a higher encoding efficiency may be achieved than in the case of orthogonal transform employing DFT and DCT.

Meanwhile, if the acoustic signals are blocked and resolved on the block basis into spectral components (real-number data obtained by an orthogonal transform in the previous example) and the resulting spectral components are quantized and encoded, the quantization noise is produced in the acoustic signals subsequently produced on block-based synthesis.

If the original acoustic signals contain signal components with acutely changing signal levels, that is portions with acutely changing levels (transient portions) in the waveform elements, and such acoustic signals are encoded and subsequently decoded, the quantization noise corresponding to the transient portions is spread to portions of the original acoustic signal other than the transient portions.

If an acoustic signal SW, such as an audio signal shown in FIG. 1A, is employed, the above-mentioned transient portion of the acoustic signal SW is an attack portion AT in which the sound is increased in intensity. The signal temporally previous to the attack portion AT consists of a sub-stationary signal FL which is generally low in changes and in signal level. If the acoustic signal SW containing the sub-stationary signal FL and the attack portion AT is blocked with a time width as shown in FIG. 1A, and the signal components in the block are orthogonally transformed, quantized and encoded, the acoustic signal SW produced subsequent to inverse orthogonal transform, decoding and dequantization is such a signal in which the large quantization noise QN attributable to the attack portion AT is diffused to the entire block.

The result is that the large quantization noise QN higher in level than the sub-stationary signal FL is produced due to the attack portion AT in the portion of the sub-stationary signal FL temporally previous to the attack portion AT. The quantization noise QN appears in the portion of the sub-stationary signal FL temporally previous to the attack portion A. This is not masked by concurrent masking by the attack portion AT, thus proving obstructions to the hearing sense.

Such quantization noise QN, appearing in the signal portion previous to the attack portion with the rapidly increased signal level is generally known as pre-echo. If the acoustic signal is orthogonally transformed over a long block for increasing the frequency resolution as described above, time resolution is worsened, thus occasionally producing pre-echo over a longer time period. For orthogonal transform of in-block signal components, a transform windowing function TW, having a characteristic curve which is smoothly changed at both end portions, as shown in FIG. 1B, is applied to the block prior to orthogonal transform for prohibiting the spectral distribution from being diffused over an excessively wide range.

If the block length for orthogonal transform is reduced in the vicinity of the attack portion, the time period of pre-echo generation may be reduced for reducing the acoustic obstructions otherwise caused by the pre-echo. That is, if, for the acoustic signal SW having the sub-stationary signal FL and the attack portion AT as shown for example in FIG. 2A, the block length for orthogonal transform is reduced in the vicinity of the transient portion with acutely changing signal amplitudes, such as the attack portion AT, and orthogonal transform is applied to signal components in the short block, the time duration of pre-echo may be sufficiently reduced in the short block. If the time duration of pre-echo is sufficiently reduced in the block, obstructions to the hearing sense may be reduced in the attack portion AT by the so-called reverse-direction masking effect. Meanwhile, when orthogonally transforming the signal components in the short block, a transform windowing function of short duration (short length transform window function TWS) as shown for example in FIG. 2B is applied before processing by orthogonal transform.

On the other hand, if the block length for orthogonal transform for the sub-stationary signal portion FL or the attack portion AT is similarly reduced, the frequency resolution is lowered, thus lowering the encoding efficiency for these portions. Thus a longer block length for orthogonal transform is preferably increased for orthogonal transform for these portions since the signal energy is concentrated for specified spectral components and hence the encoding efficiency is improved.

Thus it is actually practiced to selectively change over the block length for orthogonal transform depending upon characteristics of various portions of the acoustic signals SW. For effecting such selective switching of the block length, the transform windowing function TW is similarly switched depending upon the block length selection. For example, a longer transform windowing function TWL is used for blocks consisting of signals of the sub-stationary portion FL and signals subsequent to the attack portion AT, while a shorter transform windowing function TWS is used for the block in the vicinity of the attack portion AT, by way of performing selective switching.

By increasing the length of the block for orthogonal transform in the sub-stationary portion or in the attack and subsequent portions, and by reducing the length of the block for orthogonal transform only in the vicinity of the attack portion with acutely changing signal levels, at the cost of the frequency resolution, sufficient frequency resolution may be maintained in the portions other than the attack portion, while the time duration of the pre-echo in the attack portion may be sufficiently reduced. If the time duration of the pre-echo in the attack portion can be sufficiently reduced in this manner, the pre-echo may be masked by the reverse-direction masking by the attack portion, so that psychoacoustically unobjectionable encoding may be achieved.

However, if the method for selectively switching the block length for orthogonal transform depending upon the properties or characteristics of respective components of the acoustic signals, orthogonal transform means capable of dealing successfully with orthogonal transform for different block lengths need to be provided in the encoder, while inverse orthogonal transform means capable of dealing successfully with orthogonal transform for different block lengths need to be provided in the decoder.

If the block length for orthogonal transform is changed, the number of spectral components obtained on orthogonal transform is proportional to the block length, such that, if these spectral components are grouped and encoded on, for example, the critical band basis, the numbers of the spectral components contained in the critical bands are also changed with the block lengths, thus complicating the subsequent encoding and decoding operations.

Said differently, the method of changing the block lengths for orthogonal transform has a drawback such that both the encoder and the decoder are increased in circuit scale.

SUMMARY OF THE INVENTION

It is therefore an object of the present invention to provide a method and apparatus for encoding whereby the encoding efficiency may be improved and the pre-echo may be effectively suppressed without complicating the construction of the apparatus.

It is another object of the present invention to provide a decoding apparatus for decoding the encoded signals, an information recording medium having the encoded signals recorded thereon, and an information transmitting method, wherein encoding is done by the method and apparatus of the present invention.

In one aspect, the present invention provides an encoding method for encoding an acoustic signal having the steps of detecting an attack portion where the waveform elements of acoustic signals are acutely increased in level, gain controlling at least the waveform elements upstream of the attack portion using a gain control amount adaptively selected responsive to characteristics of the acoustic signals from among plural gain control amounts represented by pre-set powers of 2, transforming the acoustic signals into plural frequency components, and encoding the control information for gain control and plural frequency components.

In another aspect, the present invention provides an encoding apparatus for encoding an acoustic signal including means for detecting an attack portion where the waveform elements of acoustic signals are acutely increased in level, means for gain controlling at least the waveform elements upstream of the attack portion using a gain control amount adaptively selected responsive to characteristics of the acoustic signals from among plural gain control amounts represented by pre-set powers of 2, means for transforming the acoustic signals into plural frequency components, and means for encoding the control information for gain control and plural frequency components.

In another aspect, the present invention provides a decoding apparatus for decoding an encoded signal for restoring an acoustic signal, in which the encoded signal is at least an encoded version of plural frequency components transformed from the acoustic signal and an encoded version of the control correction information for gain control correction for waveform elements upstream of the attack portion where the waveform elements of the acoustic signal rise acutely in signal level. The decoding apparatus includes decoding means for decoding the encoded signals for producing plural frequency components and the control correction information, transforming means for transforming the frequency components into an acoustic signal consisting of plural waveform elements, gain control correction means for correcting the gain control of the waveform elements at least upstream of the attack portion with the aid of a gain control correction amount selected based upon said control correction information from plural gain control amounts specified by pre-set powers of 2; and means for restoring the acoustic signal from the waveform elements.

In yet another aspect, the present invention provides an information recording medium having recorded thereon the encoded information obtained on encoding plural frequency components. The frequency components are obtained by transforming an acoustic signal, wherein waveform elements upstream of an attack portion of the acoustic signal, where at least the waveform elements of the acoustic signal rise sharply in level, are gain controlled using an adaptively selected gain control amount selected from among plural gain control amounts represented by pre-set powers of 2. The control information for the above gain control is also recorded along with the frequency components.

In still another aspect of the present invention, there is provided a method for transmitting the information including transforming an acoustic signal, in which waveform elements upstream of an attack portion thereof, where at least the waveform elements of the acoustic signal rise sharply in level, are gain controlled using an adaptively selected gain control amount selected from among plural gain control amounts represented by pre-set powers of 2, into plural frequency components, encoding and transmitting the frequency components, and encoding and transmitting the control information for the above gain control.

DESCRIPTION OF THE PREFERRED EMBODIMENTS

Figure 1A:
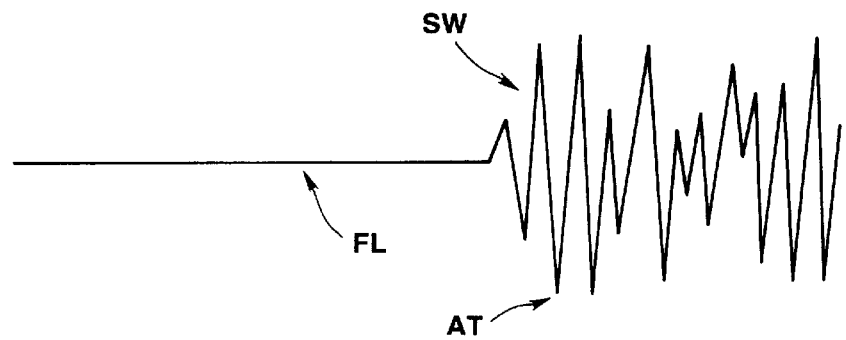
FIGS. 1A, 1B and 1C illustrate generation of pre-echo.
Figure 1B:
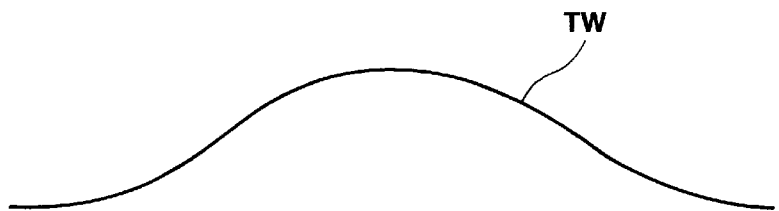
Figure 1C:
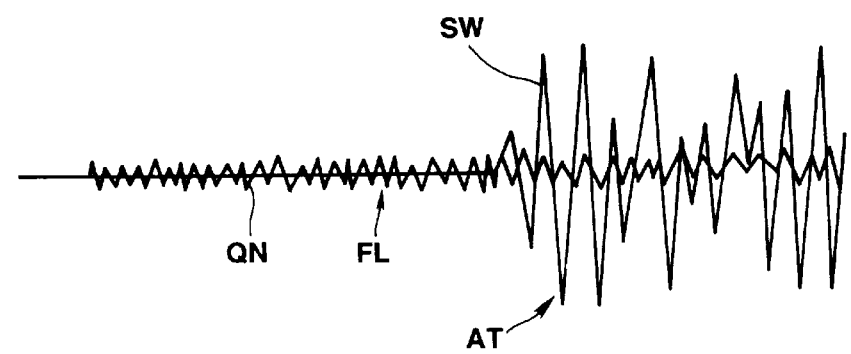
Figure 2A:
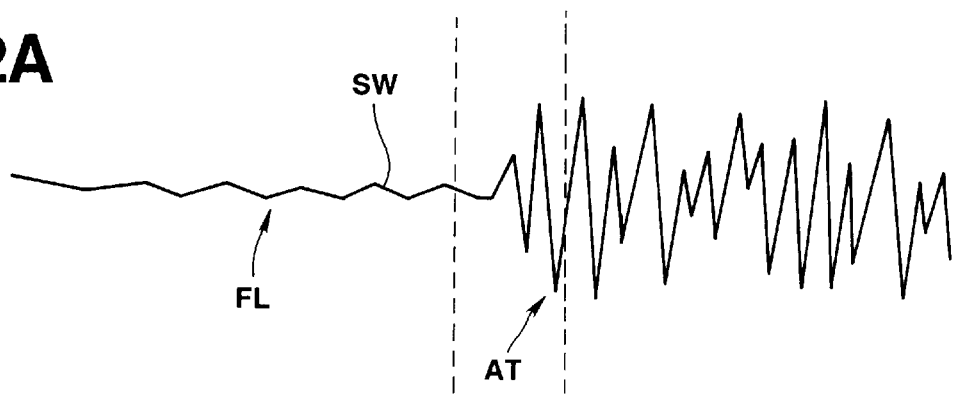
FIGS. 2A and 2B illustrate varying the block length for orthogonal transform before and after the attack portion.
Figure 2B:
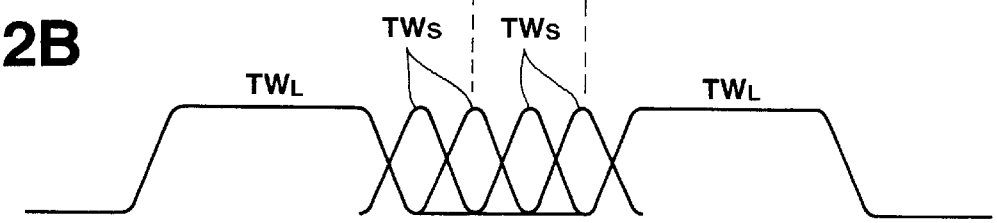

Referring to the drawings, preferred embodiments of the present invention will be explained in detail.

Figure 3:
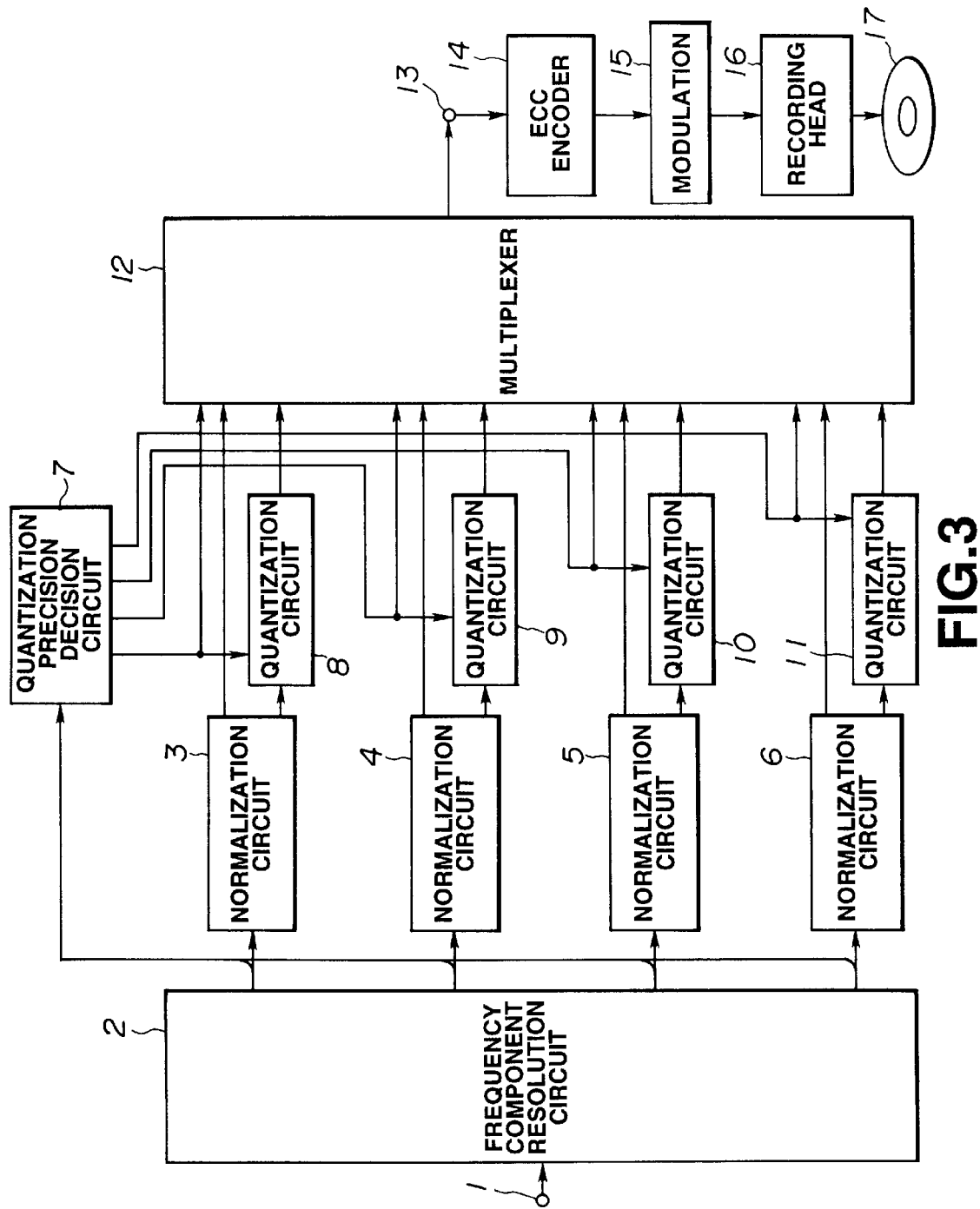
FIG. 3 is a schematic block circuit diagram showing a signal encoder embodying the present invention.

FIG. 3 shows a basic arrangement of an encoder (encoding apparatus) embodying the present invention.

In FIG. 3, to an input terminal 1 is fed a digital audio signal as an acoustic signal consisting of sample data (waveform elements). This digital audio signal is resolved into frequency components by a frequency resolving circuit 2. The method of resolving the digital audio signal into frequency components by the frequency component resolving circuit 2 may be performed by orthogonal transform, such as DFT, DCT and MDCT.

With the frequency spectrum split by a filter, such as QMF, the digital audio signal in the time domain may be split into plural frequency components by the filter. With the orthogonal transform, time-domain digital audio signals are blocked for every plural sample data, and the block-based sample data are orthogonally transformed to produce frequency components (spectral components or real-number data) which then are grouped on the band basis.

With the frequency component resolution circuit 2, splitting into frequency components is performed by a method consisting of frequency spectrum splitting by a filter, such as QMF, followed by orthogonal transform. The frequency component resolution circuit 2 splits the frequency spectrum of the digital audio signal supplied thereto into bands by a filter such as QMF and the frequency components of the resulting frequency bands are blocked. The blocked frequency components are orthogonally transformed using MDCT from block to block and the resulting frequency components are grouped on the band basis. The band widths of the frequency bands set by the filter or the frequency components after orthogonal transform are grouped on the band basis to, for example, a uniform bandwidth, or to a non-uniform bandwidth, in agreement with, for example, the critical bandwidth. Although the frequency components produced by the frequency component resolution circuit 2 are divided into four bands, in the embodiment of FIG. 3, the number may be decreased or increased, if so desired.

The frequency components of the four bands, obtained by the frequency component resolution circuit 2, are sent to normalization circuits 3 to 6 provided in association with the respective bands. The normalization circuits 3 to 6 normalize the frequency components supplied thereto at an interval of a pre-set time unit. If orthogonal transform is performed by the frequency component resolution circuit 2, the unit time is of the same length as the block for orthogonal transform. The normalization circuits 3 to 6 output normalized data of the normalized frequency components and normalization coefficient data specifying the normalization coefficients used for normalization. The normalization coefficient data from the normalization circuits 3 to 6 are sent to a multiplexor 12.

The quantization circuits 8 to 11 quantize the normalized data supplied from the normalization circuits 3 to 6 based upon the quantization precision information supplied from a quantization precision decision circuit 7.

The frequency components of the four bands from the frequency component resolution circuit 2 are also sent to the quantization precision decision circuit 7 where the quantization precision decision information sent to the quantization circuits 8 to 11 is calculated based upon the frequency components of the respective bands. The quantization precision decision information may also be calculated based upon the normalization coefficient data employed for normalization by the normalization circuits 3 to 6. The quantization precision decision information is preferably calculated by the quantization precision decision circuit 7 based upon the psychoacoustic phenomenon, such as masking effect. The acoustic model used in the decoder may be optionally set because the quantization precision decision information calculated by the quantization precision decision circuit 7 is also sent to the decoder.

The quantized data obtained on quantizing the normalized data by the quantization circuits 8 to 11, the normalized data from the normalization circuits 3 to 6 and the quantization precision decision information from the quantization precision decision circuit 7 are supplied to the multiplexor 12. The multiplexor 12 generates a codestring from the quantized data, normalization coefficient data and the quantization step information. The codestring from the multiplexor 12 is outputted at an output terminal 13. The codestring signal outputted by the output terminal 13 is recorded on an information recording medium or transmitted via an information transmitting medium.

For recording the codestring signal on, for example, an optical disc 17, as typical of the information recording medium, the codestring signal outputted by the output terminal 13 is sent to an ECC encoder 14 where an error correction code is appended to the codestring signal supplied thereto. An output of the ECC encoder 14 is sent to a modulation circuit 15 where it is modulated by eight-to-fourteen modulation. An output of the modulation circuit 15 is sent to a recording head 16 which then records the signal on the optical disc 17.

Figure 4:
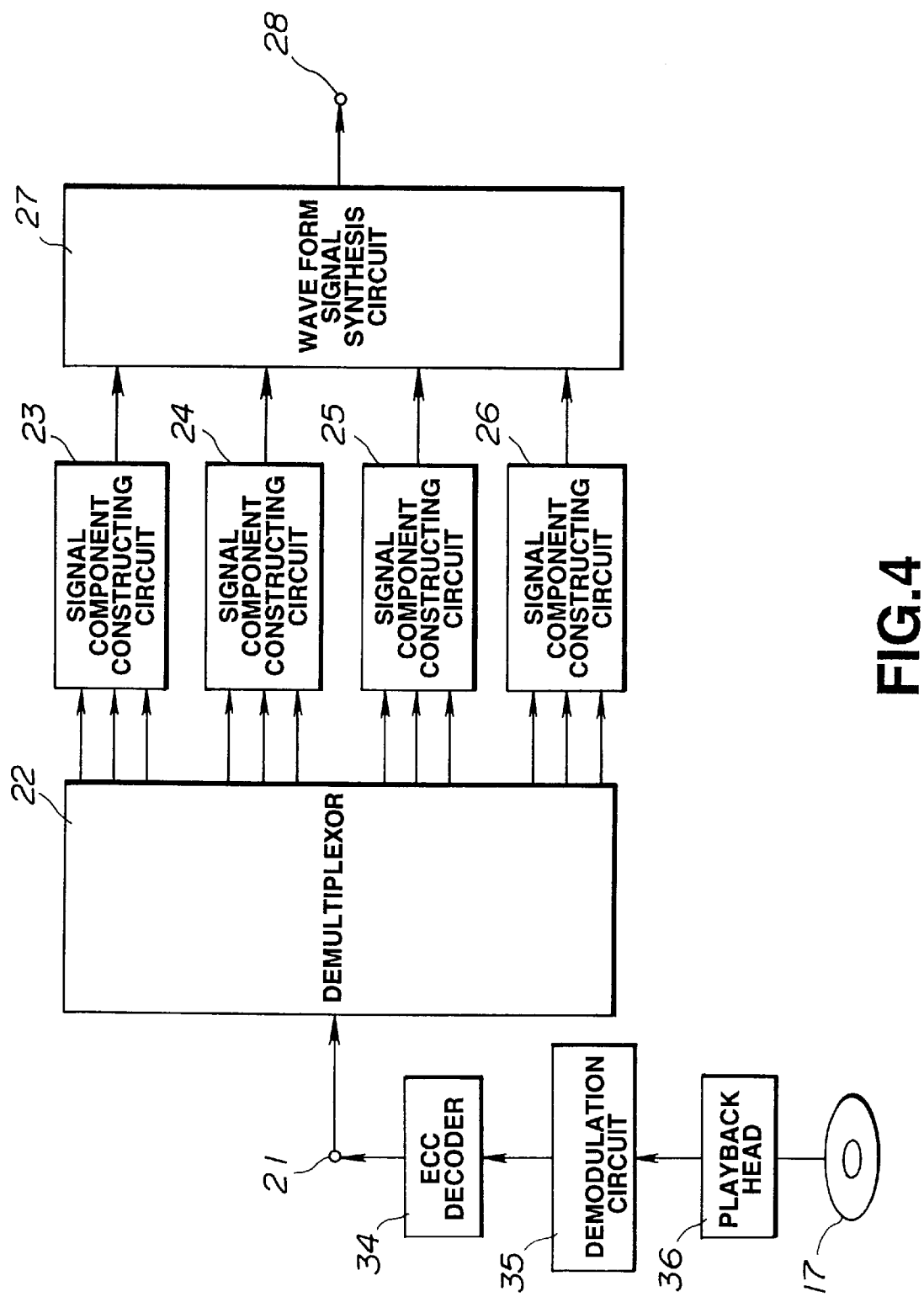
FIG. 4 is a schematic block circuit diagram showing a signal decoder embodying the present invention.

FIG. 4 shows a basic arrangement of a decoder (decoding apparatus) for decoding the codestring signal generated by the encoder shown in FIG. 3 and recorded on the information recording medium or transmitted on the transmission medium for restoring the digital audio signal.

In FIG. 4, the codestring signal, reproduced from the information recording medium or transmitted via the transmitting medium, is supplied to an input terminal 21 of the decoder.

The signal reproduced by a play back head 36 from the optical disc 17 as the information recording medium is sent to a demodulation circuit 35. The demodulation circuit 35 demodulates the eight-to-fourteen modulated signal reproduced by the reproducing head 36 from the optical disc 17. An output signal of the demodulation circuit 35 is sent to the ECC decoder 34 for error correction. The error-corrected signal is the above-mentioned codestring signal and is sent via the input terminal 21 to the demultiplexor 22. The codestring signal is made up of the quantized data, normalization coefficient data and the quantization precision decision information.

The demultiplexor 22 separates the codestring supplied thereto into the quantized data, normalization coefficient data and the quantization precision decision information of the four bands explained in connection with FIG. 3. The quantized data, normalization coefficient data and the quantization precision decision information are sent to the signal component constructing circuits 23 to 26.

The signal component constructing circuits 23 to 26 dequantize the quantized data using the quantization precision decision information while denormalizing the dequantized data using the normalization coefficient data. The signal component constructing circuits 23 to 26 restore sample data by a reconstructing operation corresponding to the resolution into frequency components carried out by the encoder shown in FIG. 3. The sample data from the signal component constructing circuits 23 to 26 are sent to a waveform signal synthesis circuit 27.

The waveform signal synthesis circuit 27 synthesizes the four bands, so that the synthesized digital audio signal is outputted by the waveform signal synthesis circuit 27. The digital audio signal is outputted at an output terminal 28 and amplified by sound radiating means, such as a speaker, headphone or an earphone, or outputted via a audio line output terminal.

If, in the above encoder, the orthogonal transform, such as DFT or DCT, is applied to resolution into frequency bands, the method now described may be thought of for effectively prohibiting the pre-echo while maintaining the block length for orthogonal transform at a pre-set length capable of assuring sufficient frequency resolution.

Figure 5A:
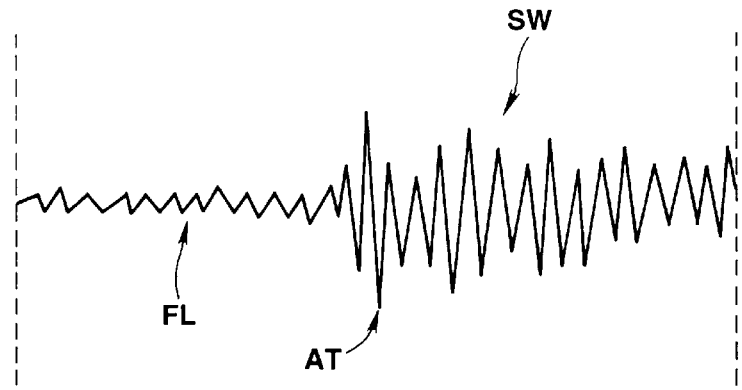
FIGS. 5A, 5B and 5C illustrate gain control for signal components ahead of the attack portion.

For encoding, the acoustic signal SW shown in FIG. 5A is sliced at a block of a pre-set length each consisting of M sample data and M1 samples are overlapped with both neighboring blocks. These blocks are multiplied with transform windowing functions TW shown in FIG. 5B (transform windowing functions TW1 to TW3) for prohibiting diffusion of the spectral distribution. It is then checked whether or not there is any attack portion AT in each block.

For a block where there is the attack portion AT, the block corresponding to the transform windowing function TW2 in FIG. 5B, the signal of small amplitude, that is the quasi-stationary signal FL, directly previous to the attack portion AT in the block, is amplified and subsequently orthogonally transformed using DFT or DCT. The resulting spectral component signals are encoded.

Since there is no attack portion AT with acutely changing waveform in FIG. 5A in the blocks associated with the transform windowing functions TW1 and TW3, the processing for signal amplification is not performed for the signal components (waveform elements) in these blocks. Conversely, since there is such attack portion AT in the block associated with the transform windowing function TW2, the processing of amplifying the small-amplitude signal (signal FL) directly previous to the attack portion AT is performed, as shown at (b) in FIG. 5C.

Specifically, by detecting the attack portion AT in a block, the block is sub-divided into small-sized domains, that is sub-blocks e1 to e7. If amplitude variation exceeds a pre-set threshold, such as 20 dB, between two neighboring sub-blocks, the portion of the block as from the sub-block where the threshold value is surpassed is detected to be the attack portion.

Figure 5B:
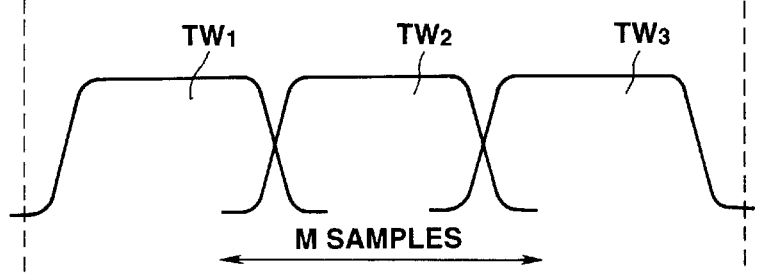
Figure 5C:
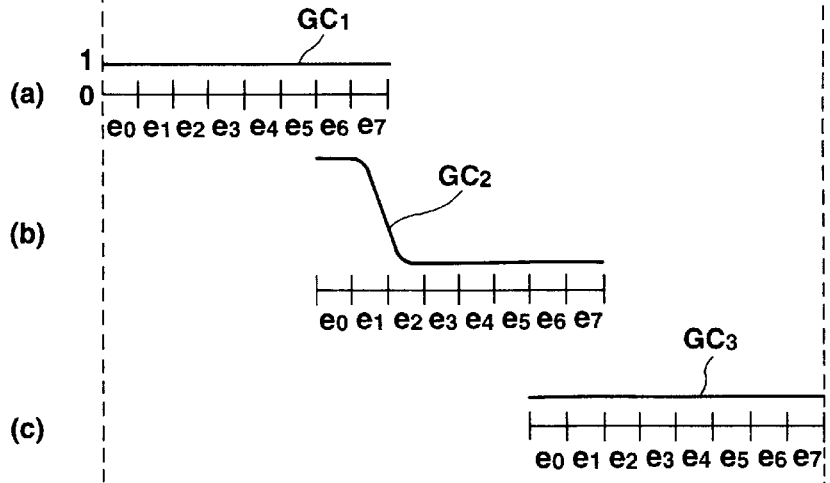

For the block detected to contain the attack portion AT (the block corresponding to the transform windowing function TW2 in FIG. 5B, the signal components within the sub-blocks e1 and e2 among the sub-blocked e1 to e7 of the block as shown at (b) FIG. 5C are amplified by being multiplied with a gain control function GC2 larger than unity (factor R). The signal components in the sub-blocks e3 to e7 where there are signal components following the attack portion AT of the block are not amplified by being multiplied with a gain control function GC2 having the gain control function equal to unity.

For the block detected not to contain the attack portion AT (the blocks corresponding to the transform windowing functions TW1 and TW3 in the embodiment of FIG. 5), the signal components within the sub-blocks e1 to e7 of the block as shown at (a) and (c) in FIG. 5C are not amplified by being multiplied with a gain control function GC2 having the gain control function equal to unity.

The encoded signals, thus recorded on the recording medium or transmitted on a transmission path subsequent to recording as described above, are subsequently decoded. For decoding, the spectral component signals, restored by decoding, are inverse orthogonal transformed by IDFT or IDCT and subsequently processed with gain control correction processing (attenuation processing) corresponding to gain control (amplification of small-amplitude signals) performed during encoding on signals directly previous to the attack portion.

Thus, by the gain control operations performed during encoding on the small-amplitude signals directly previous to the attack portion and by the gain control correcting operation performed during decoding on the signals directly previous to the attack portion during encoding, the pre-echo may be prohibited from being generated while the block length at the time of orthogonal transform remains unchanged.

Figure 6:
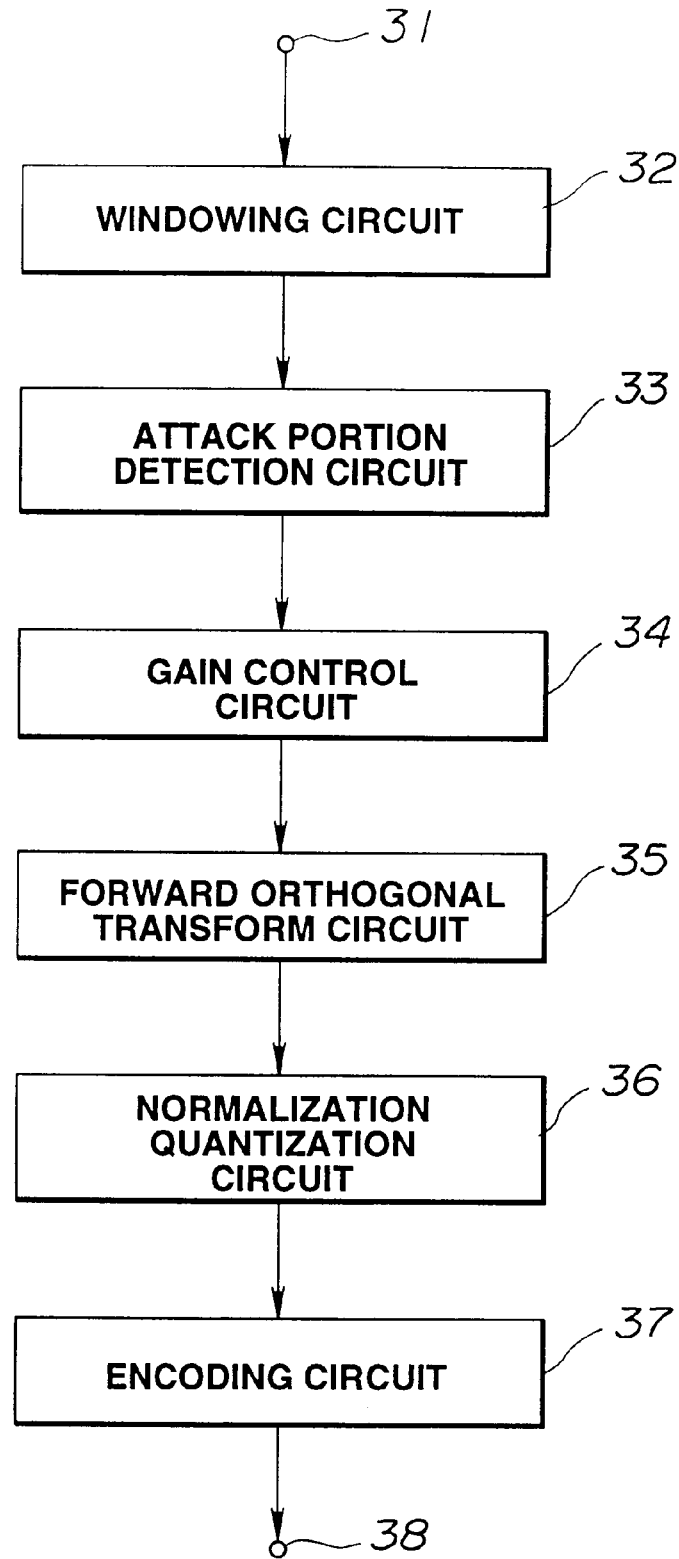
FIG. 6 is a block circuit diagram showing essential portions of the signal encoder shown in FIG. 3.
Figure 7:
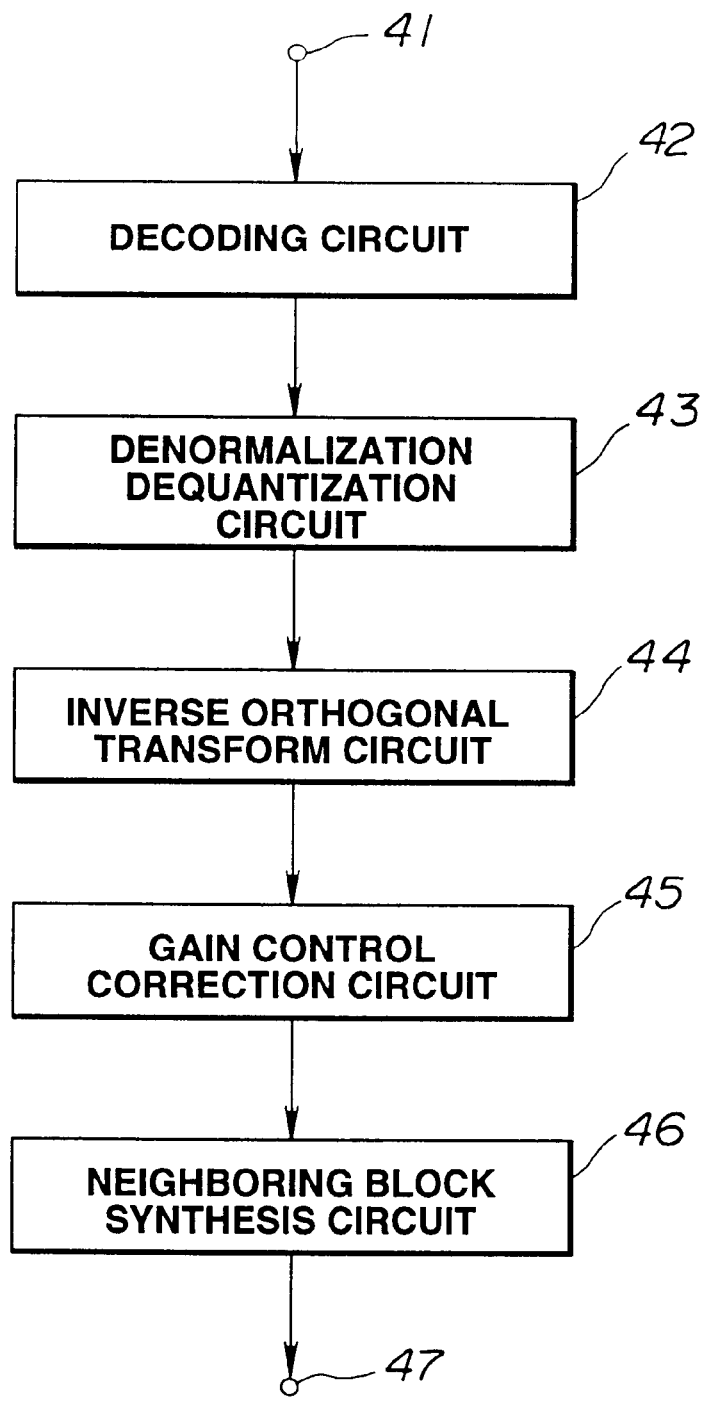
FIG. 7 is a block circuit diagram showing essential portions of the signal decoder shown in FIG. 4.

FIGS. 6 and 7 illustrate schematic arrangements of the encoder and the decoder to which the above method is applied. If the arrangement of FIG. 6 is compared to the arrangement of FIG. 3, the circuit components from a windowing circuit 32 up to a forward orthogonal transform circuit 35 in FIG. 6 are comprised in the frequency component resolution circuit 2 of FIG. 3. A normalization quantization circuit 36 of FIG. 6 corresponds to the normalization circuits 3 to 6, quantization precision decision circuit 7 and to the quantization circuits 8 to 11 of FIG. 3. An encoding circuit 37 of FIG. 6 corresponds to the multiplexor 12 and the ECC encoder 14 of FIG. 3. If the arrangement of FIG. 7 is compared to the arrangement of FIG. 4, a decoding circuit 42 of FIG. 7 corresponds to the ECC decoder 34 and the demultiplexor 22 of FIG. 4, while circuit components from a denormalization circuit 43 to a gain control correction circuit 45 of FIG. 7 correspond to the signal component synthesis circuits 23 to 26 of FIG. 4. A neighboring block synthesis circuit 46 of FIG. 7 is comprised within the signal synthesis circuit 27 of FIG. 4.

Referring to FIG. 6, the acoustic signal, such as the digital audio signal, is supplied to a terminal 31 and thence routed to the windowing circuit 32. The windowing circuit 32 slices the digital audio signal supplied thereto into blocks each of a preset length. These blocks are overlapped with the neighboring blocks and respectively multiplied with a transform windowing function.

At the next attack portion detection circuit 33, it is detected whether there is any attack portion in the block multiplied with the transform windowing function by the windowing circuit 32. This detection is made by detecting a point where the amplitude (level of the waveform elements) becomes acutely large beyond a pre-set level on the order of, for example, 29 dB across neighboring two of plural sub-blocks into which the block is sub-divided. The attack portion detection circuit 33 routes a flag specifying whether or not an attack portion is detected (an attack portion detection flag) and, if the attack portion is detected, the attack portion detection circuit routes the information as to from which of the sub-blocks in the block the attack portion begins (attack portion position information), for each block, to the gain control circuit 34, along with the signal components (waveform elements) in each block.

When supplied with the block signal component, to which is appended the attack portion detection flag specifying the presence of the attack portion, the gain control circuit 34 performs gain control processing for amplifying the small-amplitude signal (quasi-stationary signal) in the sub-block previous to the attack portion in the block. The gain control operation by the gain control circuit 34 is performed by multiplying the signal components of small amplitudes of the sub-blocks previous to the attack portion with the gain control function specifying of a value R larger than unity.

On the other hand, the gain control circuit 34 does not perform signal amplification on signal components of the block to which is appended the attack portion detection flag specifying the absence of the attack portion. Specifically, these signal components are not amplified by being multiplied with the gain control function specifying the gain control amount equal to unity. The block-based signal components (waveform elements) from the gain control circuit 34 are orthogonally transformed with DFT or DCT by the forward orthogonal transform circuit 35. The spectral component signals, produced by the orthogonal transform, are routed to the normalization quantization circuit 36.

Similar to the normalization circuits 3 to 6, quantization precision decision circuit 7 and the quantization circuits 8 to 11 of FIG. 3, the normalization quantization circuit 36 normalizes and quantizes the spectral component signals supplied thereto. The encoding circuit 37 generates a codestring signal from the quantized data, normalization coefficient data and the normalization precision information supplied from the normalization quantization circuit 36, attack portion detection flag supplied via respective portions and the attack position information in the sub-block where the attack portion has been found, as well as from the gain control amount information. The encoding circuit 37 also appends an error correction code to the codestring signal. An output of the encoding circuit 37 is outputted at a terminal 38 and modulated by the above-mentioned eight-to-fourteen modulation so as to be recorded on a recording medium or transmitted on a transmission path.

Referring to FIG. 7, to a terminal 41 are supplied playback signals from the information recording medium, demodulated by fourteen-to-eight demodulation, or the codestring signal transmitted from the transmission medium. The codestring signal, supplied to the terminal 41, is corrected for errors by the decoding circuit 42, while being resolved into the quantized data, normalization coefficient data, normalization precision information, attack portion detection flag, attack position information in the sub-block where the attack portion has been found, and the gain control amount information.

The quantized data, normalization coefficient data and the quantization precision information, from the decoding circuit 42, are sent to the denormalization dequantization circuit 43. The denormalization dequantization circuit 43 dequantizes the quantized data, using the quantization precision information, and denormalizes the normalized data using the normalization coefficient data. This causes the denormalization dequantization circuit 43 to output spectral component signals.

The spectral component signals are sent to the inverse orthogonal transform circuit 44, which then performs inverse orthogonal transform corresponding to the orthogonal transform performed by the encoder. Specifically, if the orthogonal transform in the encoder is DFT or DCT, the inverse orthogonal transform is inverse FDT (IDFT) or inverse DCT (IDCT).

The time-domain signals (waveform elements) in the time domain, obtained by inverse orthogonal transform by the inverse orthogonal transform, are sent to the gain control correction circuit 45, which is also fed with the attack portion detection flag, attack position information in the block where the attack portion has been detected, and the gain control amount information. Thus, if the small-amplitude signal of the sub-block directly previous to the attack portion in the sub-block is amplified by the gain control circuit 34 of the encoder, the gain control correction circuit 45 performs gain control correction, with the aid of the above information, for attenuating the amplified signals in the sub-block. Specifically, the gain control circuit 45 performs gain control correction of attenuating the small-amplitude signals of the sub-block previous to the attack portion, on the basis of the attack portion detection flag, specifying the presence of the attack portion in the block, gain control amount information and the attack portion position information specifying the position of the attack portion. The gain control correction in the gain control correction circuit 45 is the operation of multiplying the signal with the gain control correction function which is a reciprocal of the gain control function employed for encoding.

Of the quantization noise spread substantially uniformly in the block at the stage of inverse orthogonal transform from the frequency domain to the time domain by the inverse orthogonal transform circuit 44, the quantization noise generated directly previously to the attack portion may be suppressed to a low level by attenuating the signal amplified during encoding, thus prohibiting obstructions to the hearing sense due to the pre-echo. The gain control correction circuit 45 does not perform signal attenuation on signal components in a block where there is no attack portion and hence no amplification is performed during encoding.

The signal not amplified during encoding has been multiplied with the gain control function specifying the gain control amount equal to unity, so that it is multiplied with a gain control correction function specifying the gain control correction amount corresponding to the reciprocal of unity, that is unity. The block-based signal components via the gain control correction circuit 45 are sent to the neighboring block synthesis circuit 46.

The block sent to the neighboring block synthesis circuit 46 is previously overlapped with neighboring blocks in the encoder. Thus the neighboring block synthesis circuit 46 adds sample data in the overlapped blocks together with interference for re-constructing audio signals (digital audio signals). The digital audio signals, re-constructed by the neighboring block synthesis circuit 46, are outputted at a terminal 47 and amplified by an amplifier so as to be sent to sound radiating means, such as a speaker, headphone or an earphone, and thence outputted at an audio line output terminal.

With the above-described method, explained with reference to FIGS. 5 to 7, the attack portion is detected after multiplying the signal components in the block with the transform windowing function described above. In such case, even if the attack portion, the large-amplitude signal portion, is present in the block end portion, the inherent audio signals present in the block are deformed by multiplication of the transform windowing function, so that the large-amplitude signal at the block end is attenuated and hence no attack portion is may be detected. However, if orthogonal transform by DFT or DCT is carried out, and subsequently the inverse orthogonal transform is carried out, the signal components of the original time block may be completely restored. Thus, there is no problem raised if the gain controlling correcting operation is performed on the block basis by the decoder.

The basic method for prohibiting the pre-echo as described above is disclosed in JP Patent Kokai Application JP-A-61-201526 and in JP Patent Kokai Application JP-A-63-7023. The specifications of these patent publications are written in Japanese and the corresponding European Patents are written in German instead of in English.

If, in accordance with the method of prohibiting the pre-echo, the gain control amount at the time of amplifying the small-amplitude signals of the sub-blocks directly previous to the attack portion, the following problem arises.

Figure 8A:
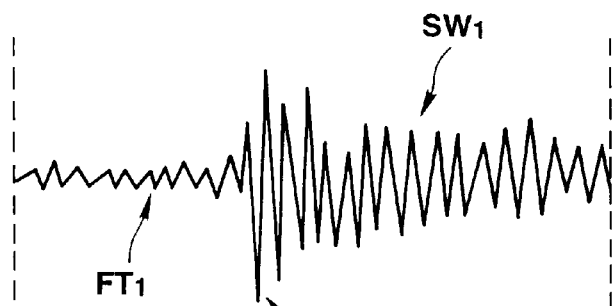
FIGS. 8A, 8B, 8C, 8D and 8E illustrate varying the gain control amount by characteristics of acoustic signals for signal components upstream of the attack portion.
Figure 8B:
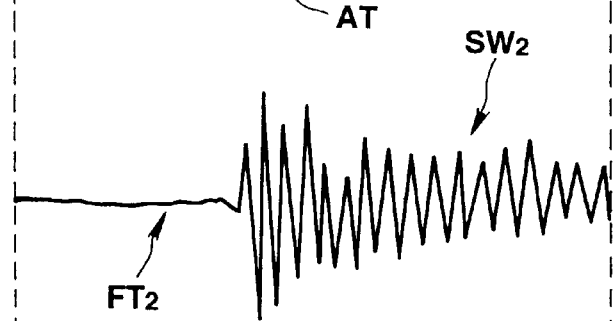
Figure 8C:
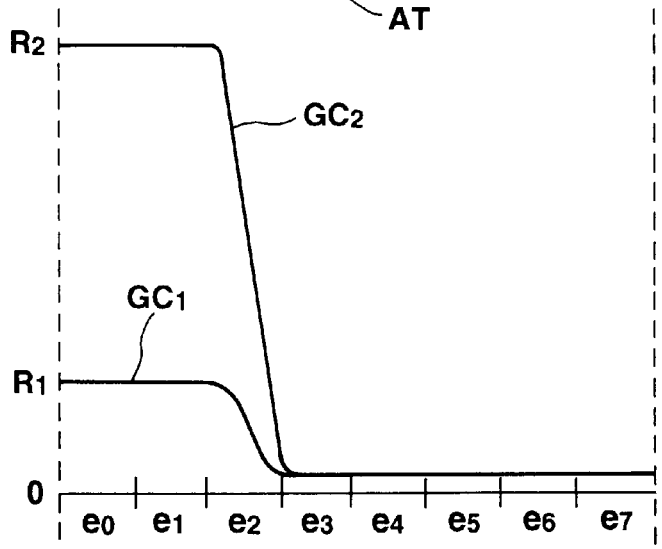

If, for example, the acoustic signal in a block is an acoustic signal SW1 shown in FIG. 8A or an acoustic signal SW2 shown in FIG. 8B, the two blocks contain attack portions AT. These acoustic signal SW1 and SW2 differ in the manner of change in signal amplitudes.

That is, in the acoustic signal SW1, an acoustic signal FT1 having a level higher than a pre-set level is present directly ahead of the attack portion AT. In such case, the pre-echo generated ahead of the attack portion AT after encoding and subsequent decoding is masked to a certain extent by the inherent acoustic signal FT1, if not so significantly as at back of the attack portion AT. Conversely, in the acoustic signal SW2, an acoustic signal FT2 directly ahead of the attack portion AT is low in signal level so that the pre-echo produced after encoding and decoding is hardly masked by the acoustic signal FT2.

It is now assumed that the attack portion AT is detected by a sole limit value of level change between neighboring sub-blocks as described above, and the small-amplitude signal directly ahead of the attack portion AT is gain-controlled using the same gain control function, while the gain control correction is performed during decoding using the same gain control correction function.

If the above limit value and the gain control function (gain control amount) are set to optimum values for the acoustic signal SW1 shown in FIG. 8A, the pre-echo of the acoustic signal SW2 shown in FIG. 8B is heard. Conversely, if the above limit value and the gain control function (gain control amount) are set to optimum values for the acoustic signal SW2 shown in FIG. 8B, the pre-echo of the acoustic signal SW1 is gain-controlled to more than a required extent, thus producing energy dispersion in the frequency domain and lowering the encoding efficiency.

This inconvenience is overcome with the method of the present invention by adaptively changing the gain control amount responsive to the extent of amplitude changes in the signal amplitude in the attack portion and the portion directly ahead of the attack portion in the acoustic signal.

That is, with the method of the present invention, the signal components of the sub-blocks e0 and e1 directly ahead of the attack portion AT of the acoustic signal SW1 are gaincontrolled with a gain control function GC1 of a smaller gain control quantity (by a factor R1), while the signal components of the sub-blocks e0 and e1 directly ahead of the attack portion AT of the acoustic signal SW2 are gain-controlled with a gain control function GC1 of a larger gain control quantity (by a factor R2). For decoding, gain control correction is performed with a gain control amount corresponding to the gain control functions GC1 or GC2 if the gain control function GC1 or the gain control function GC2 is used for gain control, respectively.

Figure 8D:
Figure 8E:
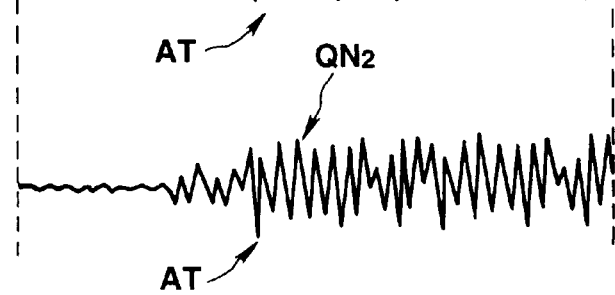

By changing the gain control amount for attack portion and the portion of the acoustic signal directly ahead of the attack portion in dependence upon the degree of signal amplitude change in the attack portion and the portion of the acoustic signal directly ahead of the attack portion, the quantization noises QN1 and QN2 generated in the acoustic signals SW1 and SW2 after encoding and decoding thereof are as shown in FIGS. 8D and 8E, respectively.

Since the gain control function GC1 in the portion of the acoustic signal directly ahead of the attack portion AT during encoding is of a smaller value, with the factor R1, and the gain control correction amount during decoding is a correspondingly small value, the noise suppression operation in the portion of the acoustic signal directly ahead of the attack portion AT is relatively small, as shown in FIG. 8D. Thus the energy of the quantization noise QN1 generated by encoding and decoding the acoustic signal SW1 through the block is low, as shown in FIG. 8D. On the other hand, since the acoustic signal FT1 ahead of the attack portion of the acoustic signal SW1 is a signal not lower than a certain level, the quantization noise of the portion directly ahead of the attack portion is masked by the acoustic signal FT1.

Conversely, if the acoustic signals SW2 are encoded and decoded, the energy of the quantization noise QN2 through the entire block is larger. However, since the gain control function GC2 in the portion of the acoustic signal directly ahead of the attack portion AT is of a larger value of R2, and the gain control correction amount for decoding is also of a correspondingly large value, the quantization noise of the portion of the acoustic signal directly ahead of the attack portion AT may be suppressed to a sufficiently low value, as shown in FIG. 8E.

In the instant embodiment of the present invention, as described above, since the pre-echo is a significant obstruction to the human hearing mechanism, priority is placed on lowering the energy of the overall quantization noise for suppressing the pre-echo by the gain control and the gain control correction if the quantization noise is not masked by the acoustic signal FT2 directly ahead of the attack portion AT, as in the case of the acoustic signal SW2.

Figure 9:
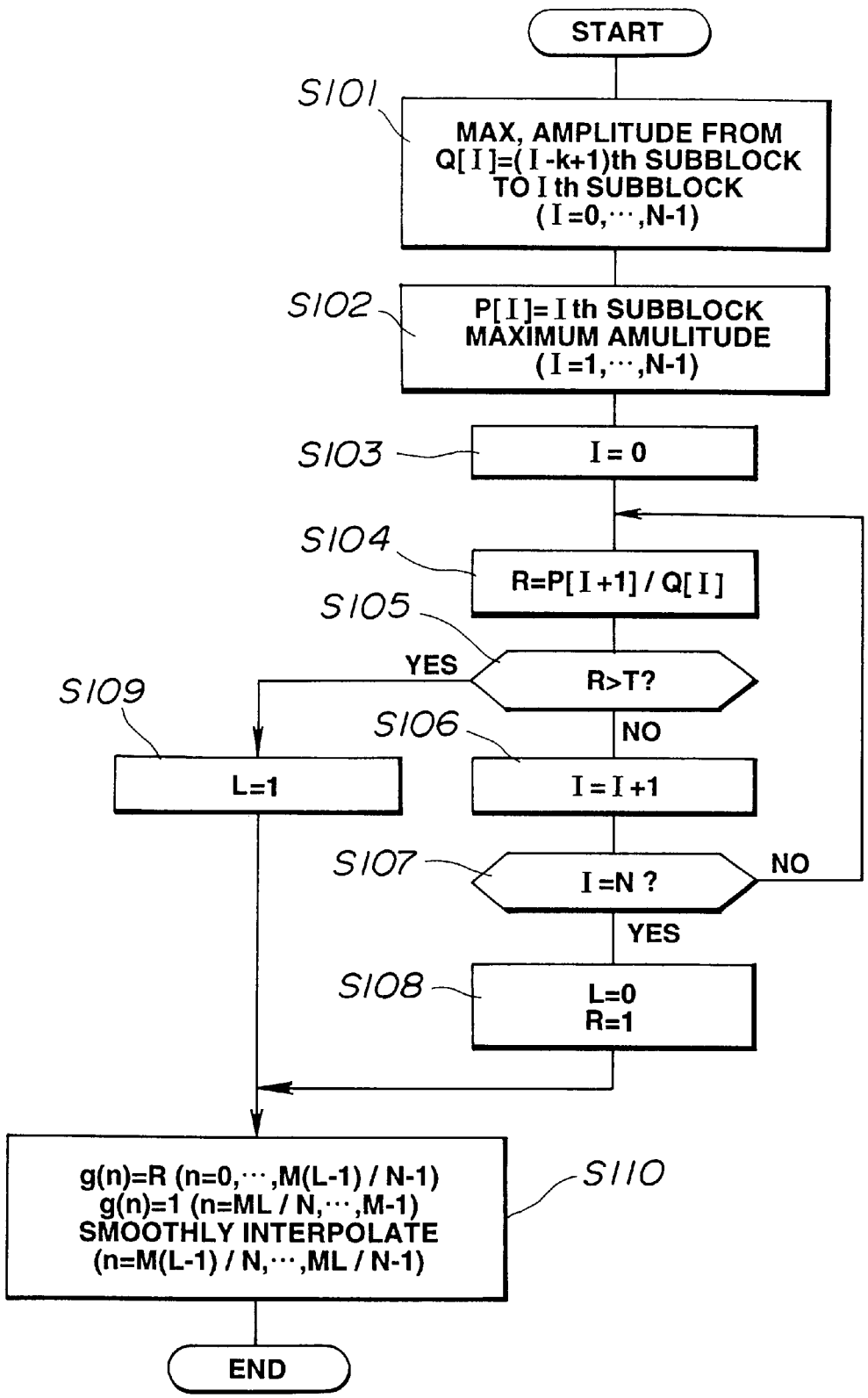
FIG. 9 is a flowchart showing the method for setting a gain control function.

FIG. 9 shows an example of a flow chart of the process for generating a gain control function by detecting the attack portion in case of applying the method of the present invention to the encoding of actual acoustic signals. The process may be incorporated in, for example, the attack portion detection circuit 33 of FIG. 6 for implementing the processing of FIG. 9 by the attack portion detection circuit 33.

In FIG. 9, a block having a length corresponding to 2 M sample data is split into N sub-blocks, and the maximum amplitude value P[I] in the I'th sub-bock is compared to the maximum amplitude value Q[I] in K continuous sub-blocks up to the I'th sub-block. If the result specifies a ratio higher than a pre-set value, the attack portion is deemed to have been detected. In addition, a gain control function corresponding to the smoothly changing gain control amount is ultimately constructed for prohibiting energy diffusion in case of orthogonal transform of the signal components in the block.

At a first step S101 of FIG. 9, the maximum amplitude value Q[I] in K continuous sub-blocks up to I'th sub-block in N sub-blocks of a block, that is from the (I−K+1)st sub-block up to the I'th sub-block, is found. At step S102, the maximum amplitude value in the I'th sub-block P[I] is found. At the next step S103, I is set to 0 (I=1). At step 104, the gain control amount R is found as a ratio of the maximum amplitude value Q[I] of K sub-blocks up to the I'th sub-block to the maximum amplitude value P[I+1] of the next following sub-block.

At the next step S105, T is a pre-set threshold value. If R is larger than T (YES), the attack portion is deemed to have been detected, so that processing transfers to step S109. If the result of decision at step S105 is NO, the processing transfers to step S106 where I is incremented by one. At step S107, it is judged whether or not I has reached the sub-block number N at the terminal end of the block. The processing as from the step S104 is repeatedly carried out until I becomes equal to N (I=N).

If the result of decision at step S107 is YES, L is set at step S108 to 0 (L=0), that is, the attack portion is deemed to be not found. Thus, R is set to 1 (R=1) and the processing transfers to step S110. If the result of detection at step S105 is YES, that is if the attack portion has been found, the processing transfers to step S109 where L is set to 1 (L=1). For R, an integer value of R as found at step S104 is substituted. That is, the length up to the attack portion in the block is construed as being the length corresponding to L sub-blocks. The corresponding value of R represents the gain control amount. After terminating the processing at step S109, the processing transfers to step S110.

At step S110, the gain control amount for the sub-blocks up to the position L of the attack portion is set to R, while interpolation is carried out for ultimately providing a smoothly changing gain control amount. The processing then comes to a close. That is, at step S110, in which the gain control function g(n) is constructed on the basis of the values of L and R, while interpolation is carried out for the sub-blocks directly ahead of the attack portion so that the gain control amount will be changed smoothly for prohibiting diffusion in energy distribution for assuring highly efficient encoding in case of transform into the frequency domain.

By changing the gain control amount of the attack portion responsive to the level of the acoustic signal, the pre-echo can be efficiently prevented from being produced even in case of a high compression ratio.

Figure 10:
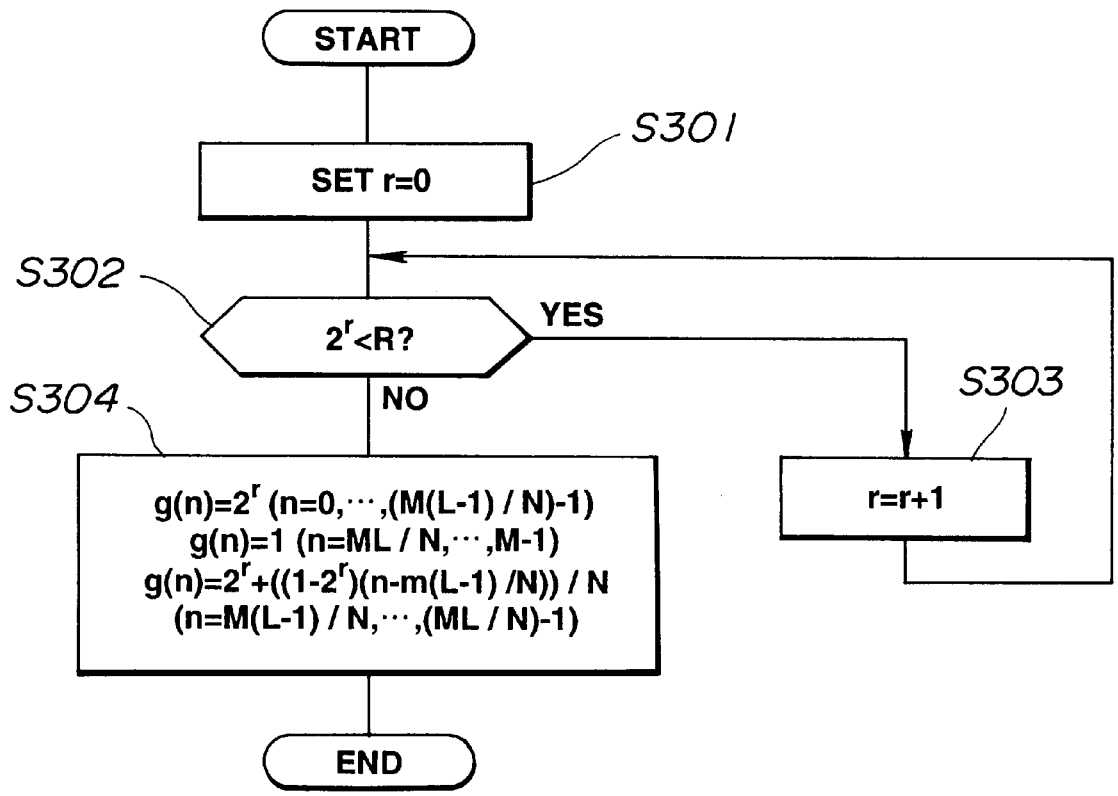
FIG. 10 is a flowchart showing the method for further facilitating the setting of a gain control function.

FIG. 10 shows the processing flow for constructing the gain control function in step S110 of FIG. 9 by simplified arithmetic-logical operations. That is, in setting the gain control amount (gain control function) for the signal components (waveform elements) of the sub-blocks ahead of the attack portion, in the processing of FIG. 10, a gain control function is selected from among plural gain control amounts (gain control functions) represented by pre-set powers of 2 (r powers of 2).

Referring to FIG. 10, if the value of R is set at step S109 of FIG. 9, the variable r is set to 0 at step S301 before the processing transfers to step S302. At step S302, it is judged which of the value of the r power of 2 and the value of R is larger. If, at step S302, the value of the r power of 2 is larger than the value of R, the processing transfers to step S303. At step S303, the value of r is incremented by 1, before the processing reverts to step S302.

If the value of the r power of 2 is found to be not more than the value of R, the processing transfers to step S304. At step S304, the gain control amount for each sub-block and of the attack portion is set to the value of the r power of 2, while that for each sub-block downstream of the attack portion is set to 1. The gain control for the sub-block directly ahead of the attack portion is set to a smoothly changing value produced on smoothing the transient portion between the power of 2 and unity. The value of the gain control amount for each block upstream of the attack portion may be easily selected from among plural pre-set r powers of 2. By selecting the gain control amount from among r powers of 2, it becomes possible for the gain control function to assume values stepped at intervals of 6 dB.

In actual digital arithmetic-logical operations, setting the function g(n) shown in the following equation (1):

$$g(n) = \begin{cases} 2^r & \left(n = 0, ..., \frac{M(L-1)}{N} - 1\right) \\ 2^r + \frac{(1-2^r)\left(n - \frac{M(L-1)}{N}\right)}{N} & \left(n = \frac{M(L-1)}{N}, ..., \left(\frac{ML}{N} - 1\right)\right) \\ 1 & \left(n = \frac{ML}{N}, ..., (M-1)\right) \end{cases} \quad (1)$$

as the gain control function shown in FIG. 10 may be realized by bit-shifting the gain control processing for the signal components (waveform elements) of the sub-blocks upstream of the attack portion by r bits towards left, that is from the LSB side to the MSB side. Thus the sub-block for which the signal components need to be multiplied with the gain control function is only one sub-block in need of interpolation, that is a sub-block directly ahead of the attack portion, thus enabling significant reduction in the volume of the arithmetic-logical operations as compared to the case of directly employing the value of R as the gain control amount as explained in connection with FIG. 9.

Figure 11:
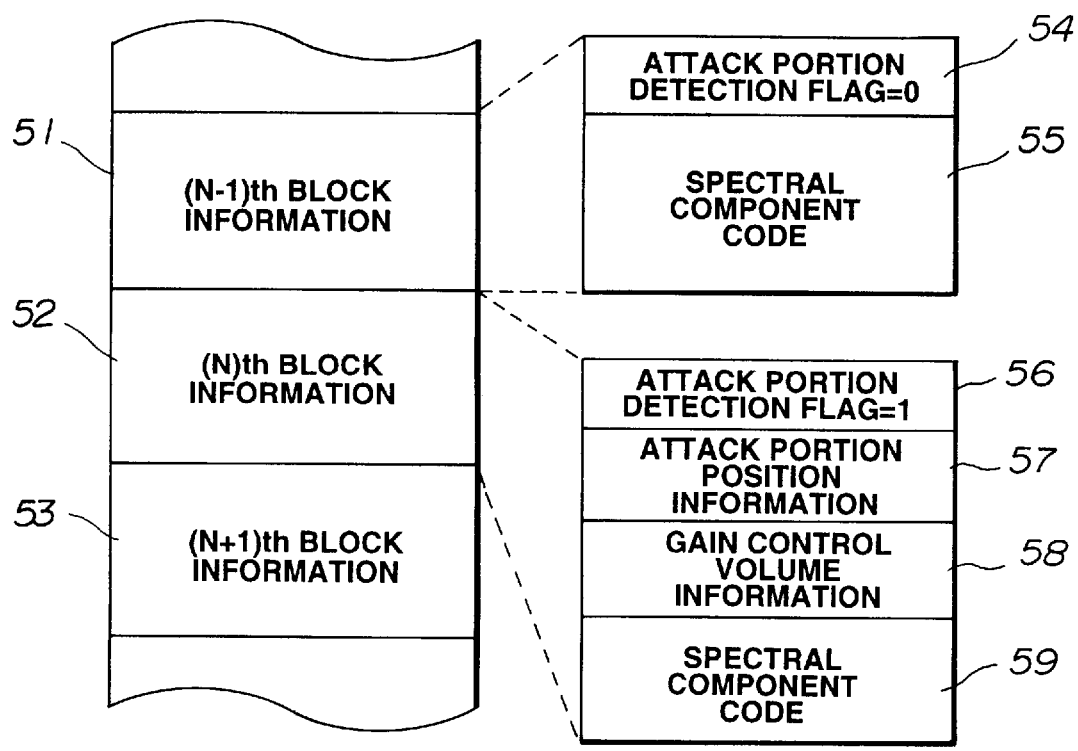
FIG. 11 shows the format of codestring signals.

FIG. 11 shows an example of codestring signals obtained on encoding the acoustic signal in accordance with the method of the instant embodiment. This codestring signal is in agreement with the recording format for recording the signals on an information recording medium, such as an optical disc, or with the transmission format for transmitting the signals over a transmission medium.

Referring to FIG. 11, block-based codestring signals (block information data) 51 to 53 at least include attack portion detection flags 54 and 56 for specifying whether or not there is an attack portion in a given block, and spectral component codes 55 and 59 obtained on normalizing, quantizing and encoding the spectral component signals.

Depending upon the contents of the attack portion detection flag, the block-based codestring signals 51 to 53 also include the gain control correction function generating information comprised of attack portion position information data 57 specifying the sub-block in the block in which begins the attack portion, and gain control amount information 58 for the sub-block upstream of the attack portion. The values of L and R as used in FIG. 9 may be used as the attack portion position information 57 and as the gain control amount information 58, respectively.

Since the ratio of the blocks where there exist attack portions subject to pre-echo is low in actual audio signals, the attack portion position information 57 and the gain control amount information 58 can be appended only to the block information data corresponding to the blocks where there exist the attack portions (the N'th block information data 52 in the example of FIG. 11) for raising the recording efficiency for the recording medium or the transmission efficiency for the transmission medium. It is of course possible to add the gain control correction function generating information to the block information data of all blocks, in which case it is sufficient if the gain control correction function generating information is appended in the form of L=0 and R=1 within the block information data or blocks where there are no attack portions.

In the processing of FIG. 10, it suffices if the value of r is appended as the gain control amount information instead of appending the value of R to the block information data.

Figure 12:
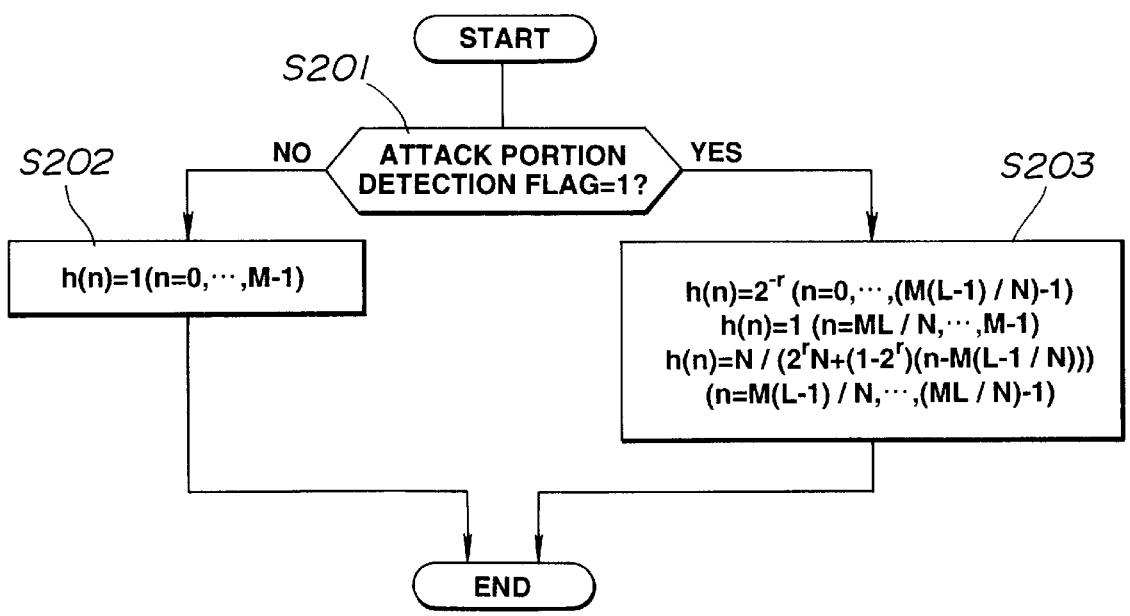
FIG. 12 is a flowchart showing the method for setting a gain control correction function.

FIG. 12 shows the processing flow for generating the gain control correction function h(n) shown in the following equation (2):

$$h(n) = \begin{cases} 2^{-r} & \left(n = 0, ..., \frac{M(L-1)}{N} - 1\right) \\ \frac{N}{2^r N + (1 - 2^r)\left(n - \frac{M(L-1)}{N}\right)} & \left(n = \frac{M(L-1)}{N}, ..., \left(\frac{ML}{N} - 1\right)\right) \\ 1 & \left(n = \frac{ML}{N}, ..., (M-1)\right) \end{cases} \quad (2)$$

from the codestring signals shown in FIG. 11. In the processing of FIG. 12, one of the plural gain control correction functions represented by pre-set powers of 2, that is r powers of 2, based upon the gain control amount information contained in the codestring signals (control correction information for gain control correction). The processing of FIG. 12 may be implemented by the gain control correction circuit 45 (FIG. 5) in which is incorporated the processing shown in FIG. 12, while signal components in the block may be regenerated by multiplying the signal component constructed by the inverse orthogonal transform in the inverse orthogonal transform circuit 44 of FIG. 7 with the gain control correction function h(n) generated by the processing shown in FIG. 12. Of course, the processing of multiplication of the gain control correction function h(n) may be omitted for a block where the attack portion has not been detected.

Referring to FIG. 12, the attack portion detection flag is taken out at step S201. If the attack portion detection flag is 0, that is if no attack portion has been found, the processing transfers to step S202 where the gain control correction function h(n), that is the gain control correction amount, is set to 1, to terminate the processing. Conversely, if the attack portion detection flag is 1, that is if the attack portion has been detected, the processing transfers to step S203, where the gain control correction function h(n) is set so as to be equal to a reciprocal of the gain control function g(n) set at step S304 of FIG. 10.

Since the gain control correction function h(n), set for the attack portion detection flag equal to 1, can be selected from plural gain control correction amounts represented by powers of 2 (r powers of 2), setting the gain control correction function h(n) in the actual digital processing may be achieved by shifting signal components (waveform elements) upstream of the attack portion towards right by r bits.

Meanwhile, the sample data from n=M(L-1)/N'th sample data up to n={(ML/N)-1}st sample data are multiplied by a value of the equation (3):

$$h(n) = \frac{N}{\left(N - \left(n - \frac{M(L-1)}{N}\right)\right)2^r + n - \frac{M(L-1)}{N}} \quad (3)$$

$$\left(n = \frac{M(L-1)}{N}, ..., \left(\frac{ML}{N} - 1\right)\right)$$

for the gain control correction function at step S203. This equation (3) may be rewritten to the equation (4):

$$h(n) = \frac{N}{(N-j)2^r + j} \quad (j = 0, ..., N-1) \quad (4)$$

Since the equation (4) is not dependent on L, the values of the equation (3) may be formed into a table by previously calculating the values of the equation (3) for respective values of r and j, with the possible values of r being r', if N is set to a fixed value. The table size at this time is r'×N.

If the decoder is constructed using a fixed decimal point digital signal processor (DSP), a large number of steps are required for division as shown by the equation (3). The number of steps and the processing time may be reduced by employing the above table.

The gain control operation by the method of the present invention may be applied not only to a case in which there is only one portion in a block where the gain of the signal components is to be changed, but also to a case in which there are plural portions in the block where the gain in the signal components is to be changed.

In addition, the gain control operation by the method of the present invention may be applied not only to a case in which the value of the gain control amount after changing the signal component by setting the factor of the gain control amount to R is equal to unity but also to a case in which the gain control amount assumes the value of the powers of 2 as in the case of other gain control amounts. For finding sample data in the transient portion of the gain control amount for decoding, it suffices to perform the gain control correction by bit shifting the respective sample data by (s–s')th powers of 2, that is, by bit shifting the sample data by (s'–s) bits in actual digital processing, after multiplication with the use of the above table. It is noted that the value of the gain control amount is s'th powers of 2 and s'th power of 2 before and after change, respectively.

In the above referenced JP patent Kokai Applications 61-201526 and 63-7023, there is disclosed an encoding method consisting of slicing acoustic signals in an encoder every plural sample data as a block, applying a windowing function to the block, detecting an attack portion, amplifying small-amplitude acoustic signals directly ahead of the attack portion (quasi-stationary signals), orthogonally transforming the amplified signals and encoding the resulting spectral component signals (real-number data).

For decoding, the decoded spectral component signals are inverse orthogonally transformed by IDFT or IDCT and the resulting signals are corrected for amplification performed on the signal portion directly ahead of the attack portion during enccoding. This prohibits the pre-echo form being produced. Since the length of the block for orthogonal transform may be kept constant at all times, the encoder and the decoder may be simplified in structure.

In U.S. Pat. No. 5117228, there is disclosed an encoding method consisting of adaptively gain controlling the input acoustic signals, orthogonally transforming spectral component signals by orthogonal transform by DFT or DCT and encoding the resulting spectral component signals. The gain control means increasing the level, that is amplifying the amplitude, if the acoustic signal level or the power level is low. With the method disclosed in the U.S. Patent, gain control is made prior to orthogonal transform so that the gain is acutely lowered at the attack portion and again raised depending upon the attenuation of the signal amplitude in the signal portion downstream of the attack portion. For decoding she signal thus gain-controlled and subsequently orthogonally transformed and encoded, gain correction control is performed for correcting the gain previously performed on the signal components produced by inverse orthogonal transform.

However, if the gain control is to be performed during encoding as described in the above referenced JP Patent publications, the sample data of the block being considered need to be multiplied with the gain control amount during encoding, while gain control correction during decoding needs to be performed by multiplying the sample data with a reciprocal of the gain control amount. These gain control and gain control correction operations lead to increased processing amounts for each block.

If, for employing the gain control amounts smoothly changed at the transition points of the changes in the gain control amount during encoding, gain control by linear interpolation is employed as described above, it is necessary to find a reciprocal of the multiplier used for encoding by calculation during gain control correction during decoding. Thus, for decoding with a DSP capable of performing fixed decimal point arithmetic operations, calculation of the reciprocal of the multiplier used for encoding is time-consuming and necessitates a large number of steps.

According to the present invention, the processing volume is not increased in the block under consideration since it is unnecessary to multiply each sample of the block with the gain control amount during encoding, and it is unnecessary to multiply the sample with the reciprocal thereof during decoding.

In addition, if gain control by linear interpolation is used for encoding, it is unnecessary with the present invention to find for gain control correction during decoding the reciprocal of the multiplier employed for encoding, so that, for gain control correction for decoding using the fixed decimal point type DSP, the reciprocal of the gain control function employed during encoding can be set easily and in a short time.

The method of the present invention may be applied not only to the case of directly resolving acoustic signals into spectral components by orthogonal transform but also to the case of resolving signal components, split in frequency from the acoustic signal by a filter, such as QMF, into spectral components. Although the method of the present invention may be applied to the processing of any signal components split in frequency spectrum or transformed into spectral components, it may be employed most effectively in connection with the spectral components obtained by processing inclusive of orthogonal transform where the generation of pre-echo presents a serious problem.

The present method may also be applied to an apparatus for processing a digital version of audio signals or processing acoustic signals by a computer after the signals are arranged into a file. Of course, the codestring signal may also be recorded on a recording medium or transmitted over a transmission medium. The present method may be applied to encoding at a perpetually constant bit rate or to encoding at a temporally variable bit rate, with the number of allocated bits being then varied from block to block.

Although the foregoing description has been made in connection with quantization of an audio signal with less outstanding quantization noise, the present method may also be applied to rendering the quantization noise of other types of signals less outstanding. For example, the present method may also be applied to video signals. However, the present method may be applied most effectively to processing audio signals since the pre-echo in the attack portion in the audio signal proves a serious hindrance to the human hearing mechanism. Of course, the present method may be applied to multi-channel audio signals.

In our International Patent Application PSC/JP95/00146, in which the United States are among the designated nations, there is disclosed a method consisting of orthogonal transforming sample data with overlap by one-half block length between neighboring blocks as in MDCT and the overlapped sample data are made to interfere with each other between the neighboring blocks during inverse orthogonal transform for decoding. With this method, gain control during encoding and gain control correction during the decoding are performed so that, if no quantization noise is generated during encoding, the original acoustic signal will be directly restored.

With this method, the pre-echo may be effectively prohibited from being produced by local gain control, while high efficiency encoding by MDCT is achieved, with the length of the block for orthogonal transform remaining constant. The above-described gain control and gain control correction according to the present invention may also be applied to the gain control and gain control correction as described in the above referenced International Patent Application.

It is seen from above that the gain control amount for gain controlling the waveform elements in the signal encoding method and apparatus of the present invention is specified by plural values of the powers of 2, so that, if the gain control of the waveform elements is performed using the gain control amount selected from among these gain control amounts, and if the waveform elements are digital data, it suffices if the digital data of the waveform elements are bit-shifted towards left in an amount corresponding to the number of the power of 2, thus significantly reducing the processing volume for the waveform elements upstream of the attack portion.

In addition, in the signal decoding apparatus of the present invention, the gain control correction amount for gain controlling the waveform elements in the signal decoding apparatus of the present invention is specified by plural values of the powers of 2, so that, if the gain control correction of the waveform elements is performed using the gain control correction amount selected from among these gain control correction amounts, and if the waveform elements are digital data, it suffices if the digital data of the waveform elements are bit-shifted towards right in an amount corresponding to the number of the power of 2, thus significantly reducing the processing volume for the waveform elements upstream of the attack portion.

Furthermore, with the signal decoding apparatus of the present invention, plural sorts of smoothly changing gain control amounts are pre-set, and a gain control correction amount selected from among plural pre-set gain control correction amounts smoothly changed between a gain control correction amount prior to change in the gain control correction amount and a gain control correction amount following the change in the gain control correction amount in the vicinity of the change point of the gain control correction, is employed, thus eliminating the processing for setting the smooth gain control correction amount in the vicinity of the change point of the gain control correction amount.

Thus the present invention assures effective prevention of pre-echo and improved encoding efficiency without complicating the construction of the processing apparatus.

What is claimed is:

1. An encoding method for encoding an acoustic signal, comprising the steps of:
    detecting an attack portion where waveform elements of acoustic signals are acutely increased in level;
    gain controlling the waveform elements upstream of said attack portion using a gain control amount adaptively selected responsive to characteristics of the acoustic signals from among plural gain control amounts represented by pre-set non-negative powers of 2;
    transforming said acoustic signals into plural frequency components; and
    encoding the control information for gain control and plural frequency components.

2. The encoding method as claimed in claim 1, wherein said gain control is performed by bit-shifting digital data corresponding to waveform elements of the acoustic signals towards left in an amount corresponding to the number of the power of 2.

3. The encoding method as claimed in claim 1, wherein a gain control amount smoothly changed between the gain control amount prior to change of the gain control amount and the gain control amount following such change is set in the vicinity of the point of such change of the gain control amount.

4. The encoding method as claimed in claim 1, wherein the acoustic signal is subdivided into plural small-sized domains each consisting of plural waveform elements and wherein said attack position is detected if the level variation of the waveform elements exceeds a pre-set limit value between two small-sized domains.

5. The encoding method as claimed in claim 1, wherein the control information for gain control at least includes the information specifying whether or not the attack portion has been detected, the information specifying the gain control amount for waveform elements upstream of the attack portion on detection of the attack portion, and the information specifying the position of the attack portion.

6. The encoding method as claimed in claim 1, wherein the processing of transforming the acoustic signal into plural frequency components comprises the steps of:
    blocking the acoustic signal every plural waveform elements; and
    orthogonally transforming the block-based waveform elements.

7. The encoding method as claimed in claim 1, wherein the characteristics of the acoustic signals in selecting the gain control amount are the degree of change in the acoustic signal based upon the level of the waveform elements upstream of the attack portion and the level of the waveform elements of the attack portion.

8. An encoding apparatus for encoding an acoustic signal, comprising:
    means for detecting an attack portion where waveform elements of acoustic signals are acutely increased in level;
    means for gain controlling the waveform elements upstream of said attack portion using a gain control amount adaptively selected responsive to characteristics of the acoustic signals from among plural gain control amounts represented by pre-set non-negative powers of 2;
    means for transforming said acoustic signals into plural frequency components; and
    means for encoding control information for gain control and the plural frequency components.

9. The encoding apparatus as claimed in claim 8, wherein said gain control is performed by bit-shifting digital data corresponding to waveform elements of the acoustic signals towards left in an amount corresponding to the number of the power of 2.

10. The encoding apparatus as claimed in claim 8, wherein a gain control amount smoothly changed between the gain control amount prior to change of the gain control amount and the gain control amount following such change is set in the vicinity of the point of such change of the gain control amount.

11. The encoding apparatus as claimed in claim 8, wherein the acoustic signal is subdivided into plural small-sized domains each consisting of plural waveform elements and wherein said attack position is detected if the level variation of the waveform elements exceeds a pre-set limit value between two small-sized domains.

12. The encoding apparatus as claimed in claim 8, wherein the control information for gain control at least includes the information specifying whether or not the attack portion has been detected, the information specifying the gain control amount for waveform elements upstream of the attack portion on detection of the attack portion, and the information specifying the position of the attack portion.

13. The encoding apparatus as claimed in claim 8, wherein the means for transforming the acoustic signal into plural frequency components blocks the acoustic signal every plural waveform elements and orthogonally transforms the block-based waveform elements.

14. The encoding apparatus as claimed in claim 8, wherein the characteristics of the acoustic signals in selecting the gain control amount are the degree of change in the acoustic signal based upon the level of the waveform elements upstream of the attack portion and the level of the waveform elements of the attack portion.

15. A decoding apparatus for decoding an encoded signal, said encoded signal being at least an encoded version of plural frequency components transformed from the acoustic signal and an encoded version of the control correction information for gain control correction for waveform elements upstream of the attack portion where the waveform elements of the acoustic signal rise acutely in signal level, comprising:
    decoding means for decoding said encoded signals for producing plural frequency components and the control correction information;
    transforming means for transforming the frequency components into an acoustic signal consisting of plural waveform elements;
    gain control correction means for correcting the gain control of the waveform elements upstream of the attack portion, using a gain control correction amount selected based upon said control correction information from plural gain control amounts specified by pre-set negative powers of 2; and
    means for restoring the acoustic signal from said waveform elements.

16. The decoding apparatus as claimed in claim 15, wherein said gain control correction is performed by bit-shifting digital data corresponding to waveform elements of the acoustic signal towards right in an amount corresponding to the number of the power of 2.

17. The decoding apparatus as claimed in claim 15, wherein, in the vicinity of the change point of said gain control correction amount, a gain control correction amount smoothly changed between the gain control correction amount prior to change and the gain control correction amount subsequent to change are selected from among plural sorts of smoothly changing gain control amounts previously set and held in a table.

18. The decoding apparatus as claimed in claim 15, wherein the control correction information for gain control correction at least includes the information specifying whether or not there is the attack portion, the information specifying the gain control correction amount for waveform elements upstream of the attack portion, if such attack portion exists, and the information specifying the position of the attack portion.

19. The decoding apparatus as claimed in claim 15, wherein the operation of transforming the frequency components into the acoustic signal consisting of plural waveform elements is a processing of inversely orthogonally transforming the frequency components for each block consisting of plural frequency components.

20. An information recording medium having recorded thereon encoded information obtained by encoding plural frequency components, said frequency components being obtained by transforming an acoustic signal, wherein waveform elements upstream of an attack portion of the acoustic signal, where at least the waveform elements of the acoustic signal rise sharply in level, are gain controlled using an adaptively selected gain control amount selected from among plural gain control amounts represented by pre-set non-negative powers of 2, with the control information for the above gain control being recorded along with the frequency components.

21. The information recording medium as claimed in claim 20, wherein said gain control is performed by bit-shifting digital data corresponding to waveform elements of the acoustic signals towards left in an amount corresponding to the number of the power of 2.

22. The information recording medium as claimed in claim 20, wherein the gain control for said acoustic signals in the vicinity of the change point of said gain control amount is smoothly changed between the gain control amount before change and the gain control amount after change.

23. The information recording medium as claimed in claim 20, wherein the control information for gain control at least includes the information specifying whether or not the attack portion has been detected, the information specifying the gain control amount for waveform elements upstream of the attack portion on detection of the attack portion, and the information specifying the attack portion.

24. The information recording medium as claimed in claim 20, wherein the processing of transforming the acoustic signal into plural frequency components is the processing of blocking the acoustic signal every plural waveform elements and orthogonally transforming the block-based waveform elements.

25. The information recording medium as claimed in claim 20, wherein the characteristics of the acoustic signals in selecting the gain control amount are the degree of change in the acoustic signal based upon the level of the waveform elements upstream of the attack portion and the level of the waveform elements of the attack portion.

26. A method for transmitting information, comprising the steps of:

transforming an acoustic signal, in which waveform elements upstream of an attack portion thereof, where at least the elements of the acoustic signal rise sharply in level, are gain controlled using an adaptively selected gain control amount selected from among plural gain control amounts represented by pre-set non-negative powers of 2, into plural frequency components;

encoding and transmitting said frequency components; and encoding and transmitting the control information for the above gain control.

27. The method as claimed in claim 26, wherein said gain control is performed by bit-shifting digital data corresponding to waveform elements of the acoustic signals towards left in an amount corresponding to the number of the power of 2.

28. The method as claimed in claim 26, wherein a gain control amount smoothly changed between the gain control amount prior to change of the gain control amount and the gain control amount following such change in the vicinity of the point of such change of the gain control amount.

29. The method as claimed in claim 26, wherein the control information for gain control at least includes the information specifying whether or not the attack portion has been detected, the information-specifying the gain control amount for waveform elements upstream of the attack portion on detection of the attack portion, and the information specifying the attack portion.

30. The method as claimed in claim 26, wherein the processing of transforming the acoustic signal into plural frequency components is the processing of blocking the acoustic signal every plural waveform elements and orthogonally transforming the block-based waveform elements.

31. The method as claimed in claim 26 wherein the characteristics of the acoustic signals in selecting the gain control amount are the degree of change in the acoustic signal based upon the level of the waveform elements upstream of the attack portion and the level of the waveform elements of the attack portion.

32. A decoding method for decoding an encoded signal, said encoded signal being at least an encoded version of plural frequency components transformed from the acoustic signal and an encoded version of the control correction information for gain control correction for waveform elements upstream of the attack portion where the waveform elements of the acoustic signal rise acutely in signal level, comprising the steps of:

decoding said encoded signals for producing plural frequency components and the control correction information;

transforming the frequency components into an acoustic signal consisting of plural waveform elements;

correcting the gain control of the waveform elements upstream of the attack portion, using a gain control correction amount selected based upon said control correction information from plural gain control amounts specified by preset negative powers of 2; and restoring the acoustic signal from said waveform elements.

33. The decoding method as claimed in claim 32, wherein said gain control correction is performed by bit-shifting digital data corresponding to waveform elements of the acoustic signal towards right in an amount corresponding to the number of the power of 2.

34. The decoding method as claimed in claim 32, wherein, in the vicinity of the change point of said gain control correction amount, a gain control correction amount smoothly changed between the gain control correction amount prior to change and the gain control correction amount subsequent to change are selected from among plural sorts of smoothly changing gain control amounts previously set and held in a table.

35. The decoding method as claimed in claim 32, wherein the control correction information for gain control correction at least includes the information specifying whether or not there is the attack portion, the information specifying the gain control correction amount for waveform elements upstream of the attack portion, if such attack portion exists, and the information specifying the position of the attack portion.

36. The decoding method as claimed in claim 32, wherein the operation of transforming the frequency components into the acoustic signal consisting of plural waveform elements is a processing of inversely orthogonally transforming the frequency components for each block consisting of plural frequency components.

* * * * *